United States Patent
Adams et al.

(10) Patent No.: US 7,751,266 B2
(45) Date of Patent: Jul. 6, 2010

(54) HIGH PERFORMANCE READ BYPASS TEST FOR SRAM CIRCUITS

(75) Inventors: Chad Allen Adams, Byron, MN (US); Derick Gardner Behrends, Rochester, MN (US); Daniel Mark Nelson, Rochester, MN (US); Jeffrey Milton Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/146,777

(22) Filed: Jun. 26, 2008

(65) Prior Publication Data

US 2009/0323445 A1 Dec. 31, 2009

(51) Int. Cl.
*G11C 29/00* (2006.01)
(52) U.S. Cl. .................. 365/201; 365/154
(58) Field of Classification Search .......... 365/154, 365/201; 327/203, 208; 714/718
See application file for complete search history.

(56) References Cited

U.S. PATENT DOCUMENTS

| 5,973,529 A | * | 10/1999 | Chappell et al. | ............ 327/200 |
| 6,989,691 B2 | * | 1/2006 | Campbell | .................... 326/95 |
| 2009/0287971 A1 | * | 11/2009 | Adams et al. | ............... 714/718 |

* cited by examiner

*Primary Examiner*—Vu A Le
(74) *Attorney, Agent, or Firm*—Rabin & Berdo, PC (57) ABSTRACT

A design structure embodied in a machine readable medium used in a design process and an integrated circuit for high performance SRAM (Static Random Access Memory) read bypass for BIST (built-in self-test). The design structure and integrated structure includes a dynamic to static conversion unit for a read output of an SRAM array, and a test bypass unit integrated into the dynamic to static conversion unit, so as to allow the read output of the SRAM array to pass through in a non-test mode without impacting performance, and bypass the read output of the SRAM array and allow a test signal to pass though in a test mode.

18 Claims, 6 Drawing Sheets

HIGH PERFORMANCE READ BYPASS TEST FOR SRAM CIRCUITS

BACKGROUND

1. Technical Field

The present invention relates to a design structure. More specifically, it relates a design structure for high performance SRAM (Static Random Access Memory) read bypass for the built-in self-test.

2. Background Information

Built-in self-test (BIST) is a mechanism used within an integrated circuit (IC) to verify all or a portion of the internal functionality of the IC. BIST can reduce the duration of an IC manufacturing test, and, by reducing the number of input/output signals that must be driven or examined under tester control, reduce the complexity of the test setup. Hence, BIST can effectively reduce the cost of IC manufacturing tests. BIST can also be designed to perform field-diagnostics of individual devices or entire systems. For example, it can used to perform a self-diagnostic test for a computer peripheral device (e.g. a printer) at its power-up.

Figure 1:
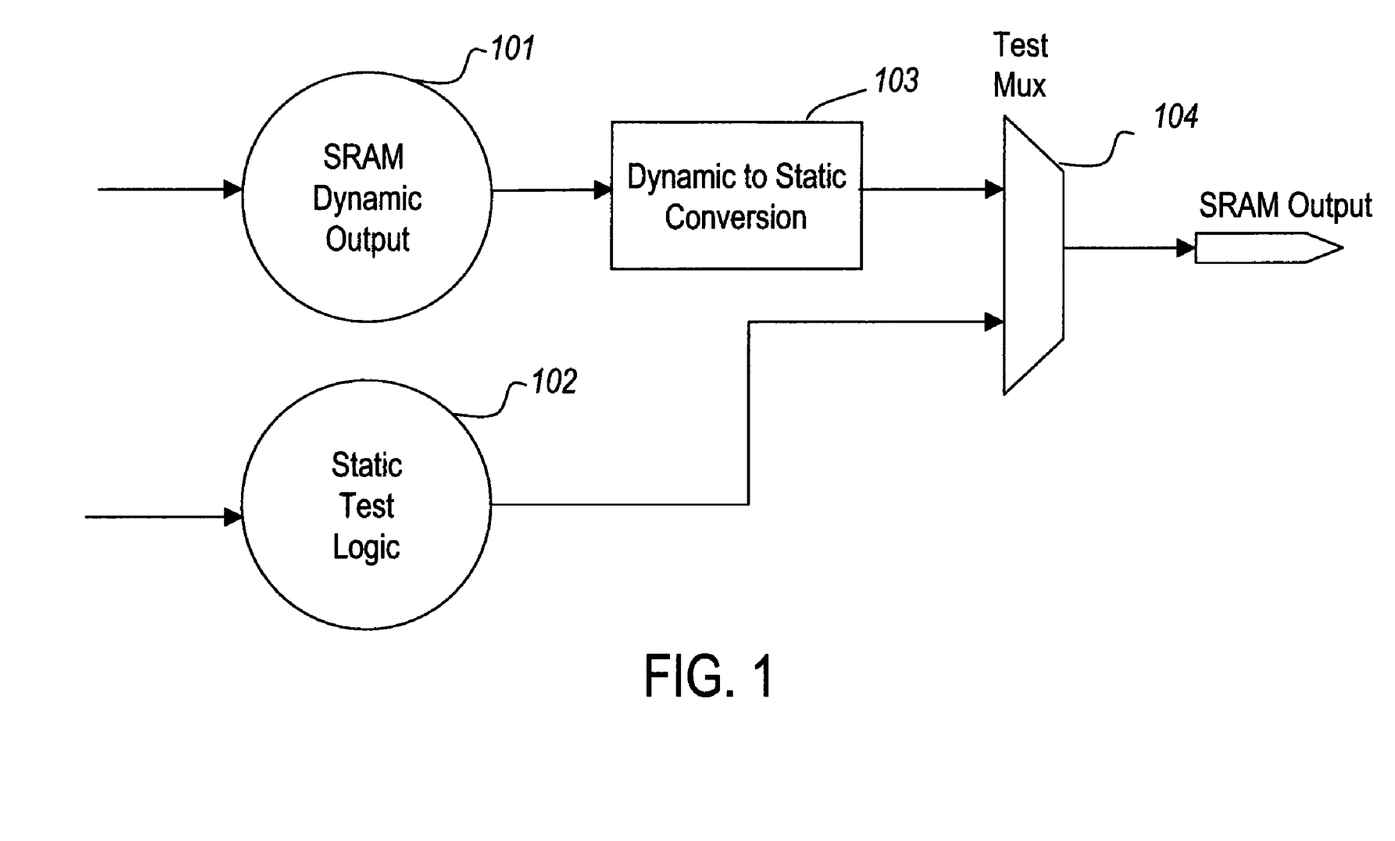
FIG. 1 is a diagram of a conventional read path dynamic-to-static conversion and static test bypass configuration.

Logic BIST (LBIST) is one type of BIST technology, which is designed for testing random logic. Some LBIST interfaces for SRAM arrays require the ability to test downstream chip logic by bypassing the functional output of the array, and inserting test signals into the SRAM array read output path. FIG. 1 is a diagram illustrating components of a LBIST interface. In FIG. 1, the components for functional output of the SRAM array include an SRAM Dynamic Output unit 101 and a Dynamic to Static Conversion unit 103. A Static Test Logic Unit 102 is used for test purposes. To bypass the functional output, a control unit 104 needs to be implemented. FIG. 1 illustrates a common method of accomplishing the SRAM bypass, in which a multiplexer (the Test Mux 104) is used at the output of the Dynamic to Static Conversion unit 103, and a test signal from the Static Test Logic unit 102 is used to select static test data.

However, when using a multiplexer to bypass the functional output of an SRAM array, extra circuitry is required to be added to the critical output path for SRAM operations, and thus results in an increased delay.

SUMMARY

A design structure embodied in a machine readable medium used in a design process and an integrated circuit for high performance SRAM (Static Random Access Memory) read bypass for the built-in self-test. The design structure and integrated structure includes a dynamic to static conversion unit for a read output of an SRAM array, and a test bypass unit integrated into the dynamic to static conversion unit, so as to allow the read output of the SRAM array to pass through in a non-test mode, and block the read output of the SRAM array and allow a test signal to pass though in a test mode.

DETAILED DESCRIPTION

The invention will now be described in more detail by way of example with reference to the embodiments shown in the accompanying Figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed to a mechanism to integrate the LBIST test function into the hold path of the dynamic to static conversion unit, thus removing load from the critical path and improving overall performance.

Figure 2:
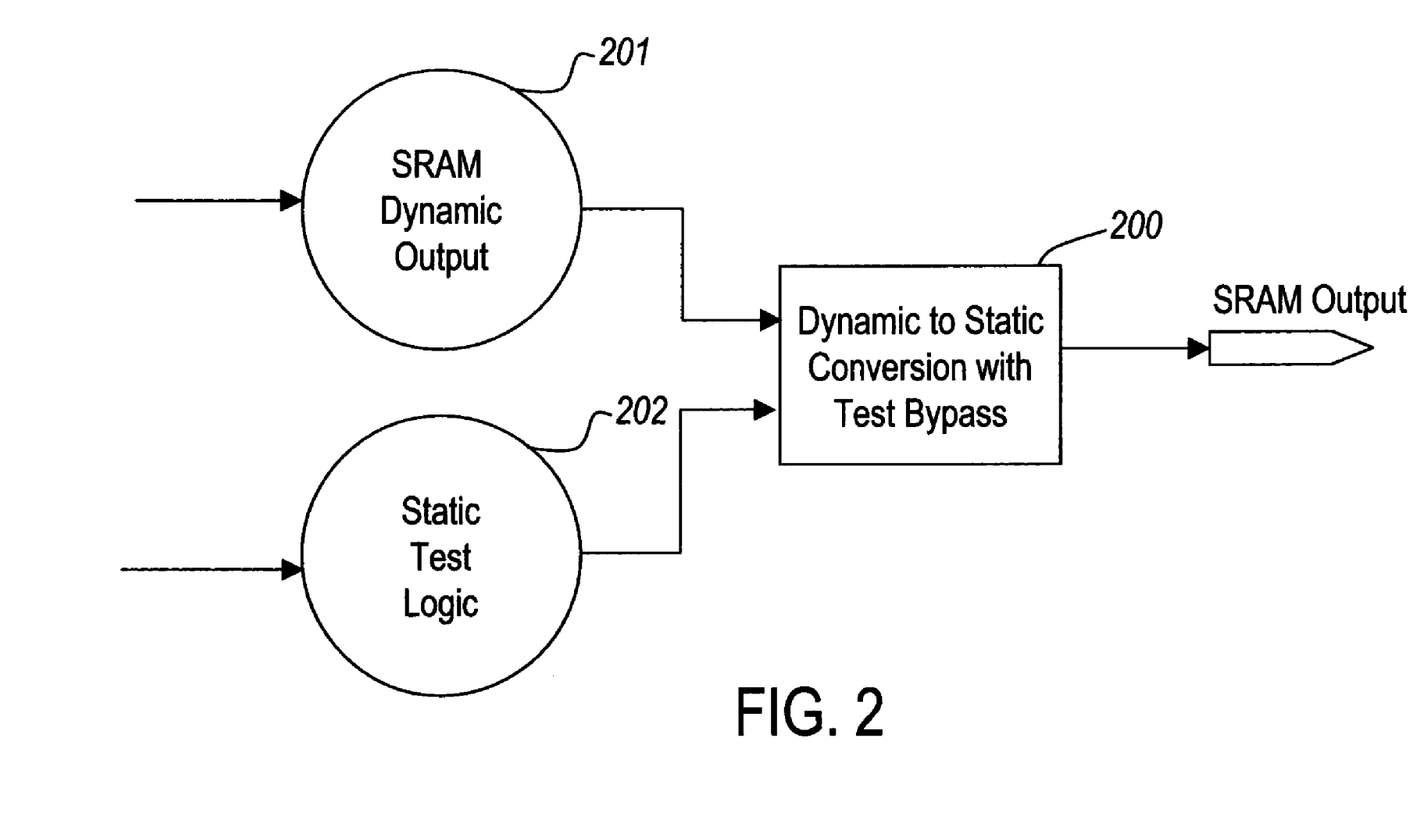
FIG. 2 is a diagram of the configuration with integrated dynamic-to-static conversion and test bypass (DSC-TB) unit in one embodiment of the present invention.

FIG. 2 is a diagram illustrating the configuration with integrated dynamic-to-static conversion and test bypass in one embodiment of the present invention.

As illustrated in FIG. 2, in one embodiment of the present invention, the traditional LBIST test bypass logic (e.g. the Test Mux 104 in FIG. 1) is removed from the critical path. The present invention has an SRAM Dynamic Output unit 201 for functional output and a Static Test Logic unit 202 for testing. The SRAM Dynamic Output unit 201 can be the same as the SRAM Dynamic Output unit 101 in FIG. 1, and the Static test Logic unit 202 can be the same as the Static Test Logic unit 102 in FIG. 1. A Dynamic to Static Conversion with Test Bypass (DSC-TB) unit 200 is used to both perform the dynamic to static conversion and bypass the functional output, when the respective work mode is chosen. Since no extra circuitry in the critical output path is needed to control the output flow in the testing mode, the overall performance will be improved. An integrated DSC-TB unit 200 will not negatively affect the power consumption, nor will it add burden to its size constraints.

Figure 3:
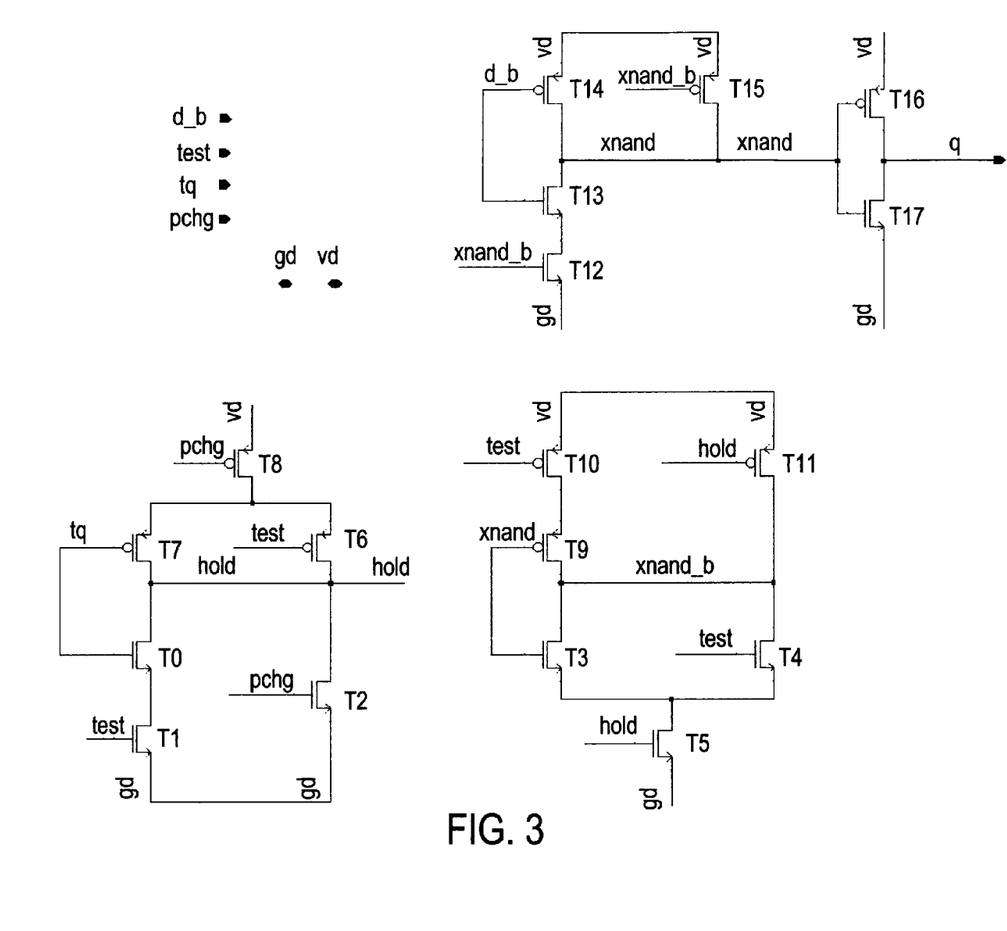
FIG. 3 is a circuit diagram illustrating the structure of the DSC-TB unit in one embodiment of the present invention.

According to one embodiment of the present invention, the DSC-TB unit 200 is created by modifying the Dynamic to Static Conversion unit 103 in two ways. The Dynamic to Static Conversion unit 103 is implemented by using a standard cross-coupled device. To build a DSC-TB unit 200, one extra leg and a complex gate hold buffer (as shown in FIG. 3) are added to the Dynamic to Static Conversion unit 103. The test function is thus implemented in the hold path, so that the original test structure 104 from the critical path can be removed.

FIG. 3 is a circuit diagram illustrating the structure of the DSC-TB unit 200 in one embodiment of the present invention.

In FIG. 3, devices T12-T15 constitute the top half of the DSC-TB unit 200, which is a normal cross-coupled device, as the one used in the Dynamic to Static Conversion unit 103. Devices T0-T2 and T6-T8 constitute a hold buffer. The hold buffer is connected to the clock ('clk') equivalent leg of the cross-coupled device (T12-T15), thus making the cross-couple device (T12-T15) a latch, and controls the state of the latch. Therefore, this circuit can work in both a functional mode and a test mode (as describe below). By choosing the test mode, the circuit can switch from a functional mode to a test mode to realize the built-in self test. It can feed test data ('tq') through the cross-coupled device (T12-T15) during this operation, and effectively "bypass" the input from the SRAM array. Devices T3-T5 and T9-T11 constitute the bottom half of the DSC-TB unit 200, which uses a complex gate implementation. Devices T3-T5 and T9-T11 are designed to isolate the 'xnand' signal, and select test data 'tq', when working in the test mode. In an alternate embodiment of the present invention, a cross-coupled nor implementation may be used instead of the cross-coupled nand implementation. The cross-coupled nor implementation will use the same number of devices in slightly altered order, but the DSC-TB and the devices will operate in the same manner.

According to one embodiment of the present invention, the DSC-TB unit 200 can operate in two modes:

1. The Functional Mode

This is the normal mode of operation, in which the 'test' signal is held low and the circuit operates as a normal cross-coupled device.

In the functional mode, the circuit is capable of reading one bit from the array per cycle, and when needed, it can also hold data for multiple cycles until the next read operation takes place. A 'precharge' signal ('pchg') is typically used for pre-charging a data line and other dynamic signals, but in this circuit its main role is to define the timings of the capture and hold state of the latch. With the 'test' signal held low, the 'hold' signal becomes the inversion of the 'pchg' signal, and the devices T4 and T10 connected by the 'test' signal become transparent. Thus, the device operates as a conventional CCNAND (Cross-Coupled Not And) circuit, where the 'hold' signal acts as the clocking/controlling signal. Therefore, when the 'pchg' signal is low, the 'hold' signal is high, and then the cross-coupled device is in a "hold" state. However, when the 'pchg' signal rises, the pre-charge device T8 turns off, the 'hold' signal becomes low, and the device enters a "capture" state in which it accepts the data input (i.e. the 'd_b' signal). The output 'q' signal of the DSC-TB unit 200 is independent of any inputs of the unit, when the 'pchg' signal remains low (i.e. in the "hold" state) and the 'test' signal remains low (i.e. the unit is in the "functional" mode). In the functional mode, the input signal for testing, 'tq', is gated as long as the 'test' signal remains low, and plays no role in this mode.

Figure 4:
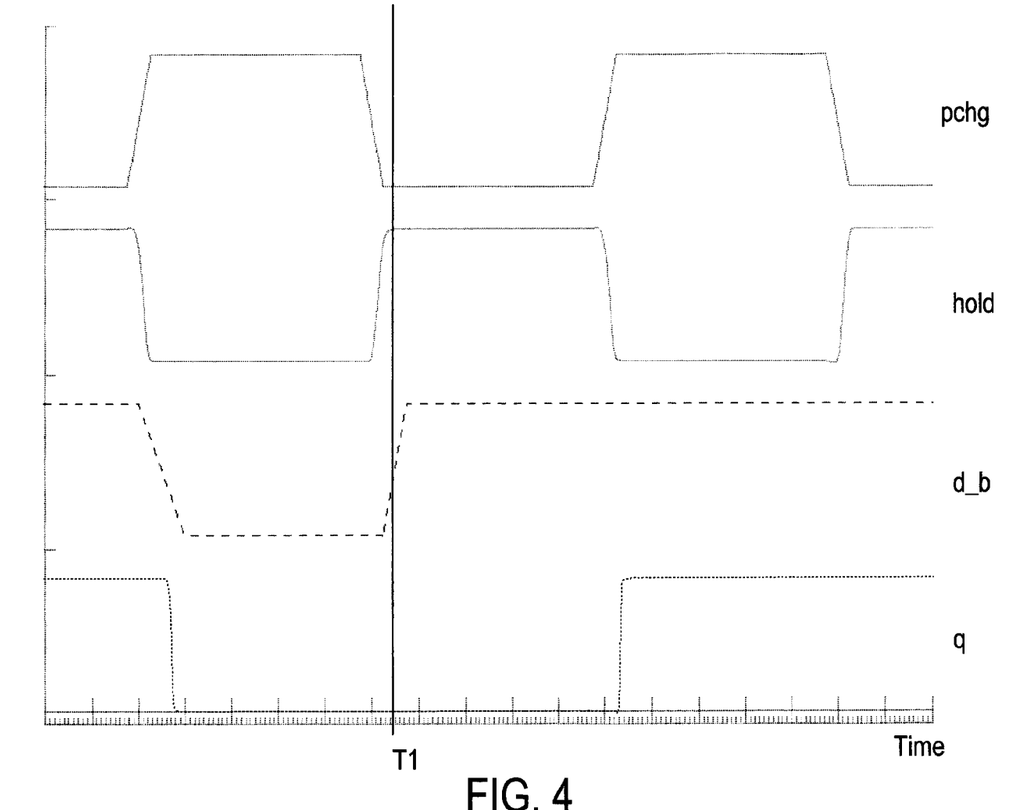
FIG. 4 is a waveform illustrating the operation of the DSC-TB unit in the functional mode.

A waveform of the functional mode operation of the DSC-TB unit 200 can be seen in FIG. 4.

FIG. 4 illustrates two read cycles—a cycle of reading '0' followed by a cycle of reading '1'. In the functional mode, the 'test' signal will remain low (not shown in FIG. 4). The 'hold' signal is the inversion of the 'pchg' signal. The output signal 'q' follows the data input signal 'd_b' during the "capture" state when the 'pchg' signal is high. The output signal 'q' will remain if it is in the "hold" mode when the 'pchg' signal is low. For example, the 'd_b' signal turns high at time T1, but the 'q' signal remains low because the 'pchg' signal is low during that period of time, and hence the circuit is in the "hold" mode. The 'tq' input signal (not shown in FIG. 4) is gated in this operational mode. The output signal 'q' is independent of the test input signal 'tq'.

2. The Test Mode

The DSC-TB unit 200 enters the test mode whenever the 'test' signal is held high. In one embodiment of the present invention, in the test mode, the 'pchg' signal is kept low to force the cross-coupled device into its "hold" state, and to pre-charge the functional 'd_b' input. In this "hold" state, a low 'pchg' signal effectively forces the gate connected to the 'pchg' devices (T2 and T8 in FIG. 3) to be transparent. The 'hold' signal is then an inversion of the 'tq' input. When the 'test' signal is high, the 'xnand' signal is isolated by device T10, and the 'xnand_b' signal becomes an inversion of the 'hold' signal. While the 'd_b' signal held high, the second gate (T15 in FIG. 3) in the cross-coupled device causes an inversion of the 'xnand_b' signal. Therefore, the output signal 'q' follows the original static testing input signal 'tq'. In this embodiment, the 'pchg' signal is always low in test mode. The device input signal 'd_b' is thus held high and plays no role.

In alternative embodiments of the present invention, the 'pchg' signal may be held high. A 'pchg' signal toggled to high would force the 'hold' signal to be low, the 'xnand_b' signal to be high, the 'xnand' signal to be low, and, ultimately, the 'q' signal to be high. This may be useful when a high output signal is preferred in an application. Similarly, in another embodiment of the present invention, the 'd_b' signal may be toggled in the test mode.

Figure 5:
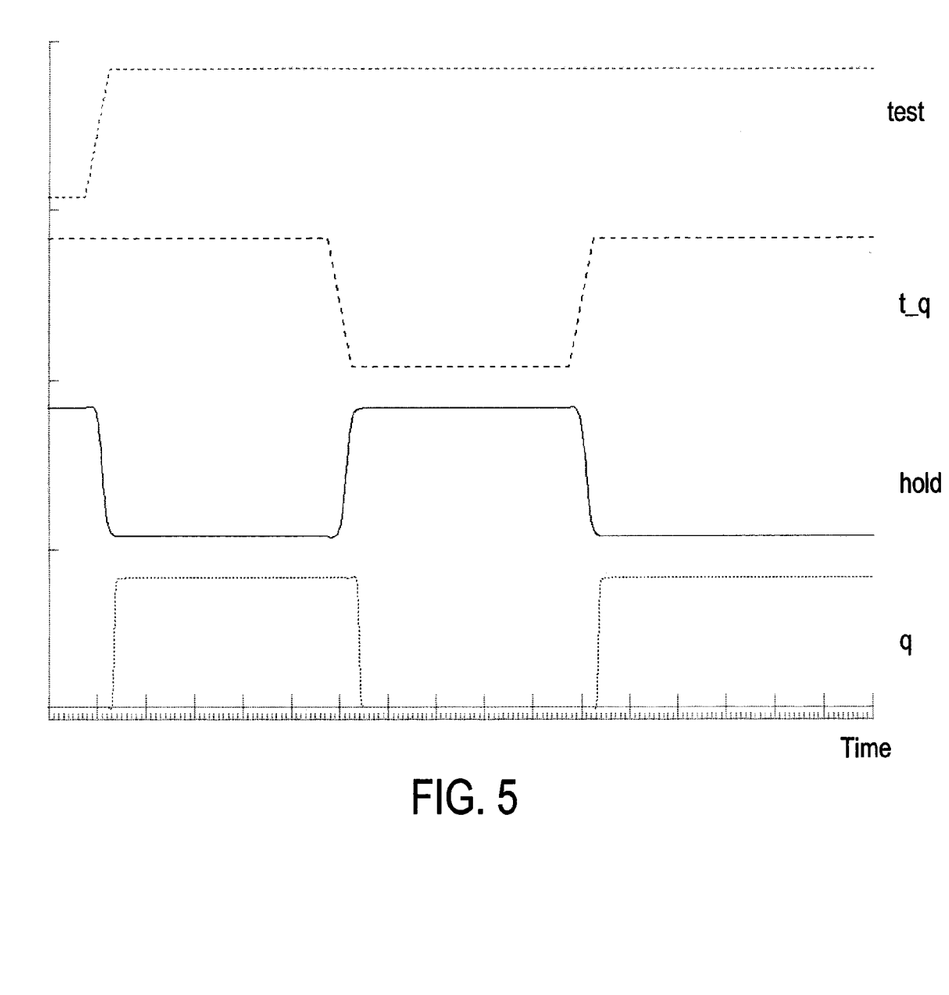
FIG. 5 is a waveform illustrating the operation of the DSC-TB unit in the test mode.

FIG. 5 illustrates a waveform of the DSC-TB unit in the test mode.

In the test mode, the 'pchg' signal is kept low (not shown in FIG. 5). When the 'test' signal is high, the output signal 'q' follows the test input signal 'tq'. The 'hold' signal is the inversion of the 'tq' signal. In this example, data input signal 'd_b' is always high (now shown in FIG. 5), and the output 'q' is independent of the data input from 'd_b'.

Figure 6:
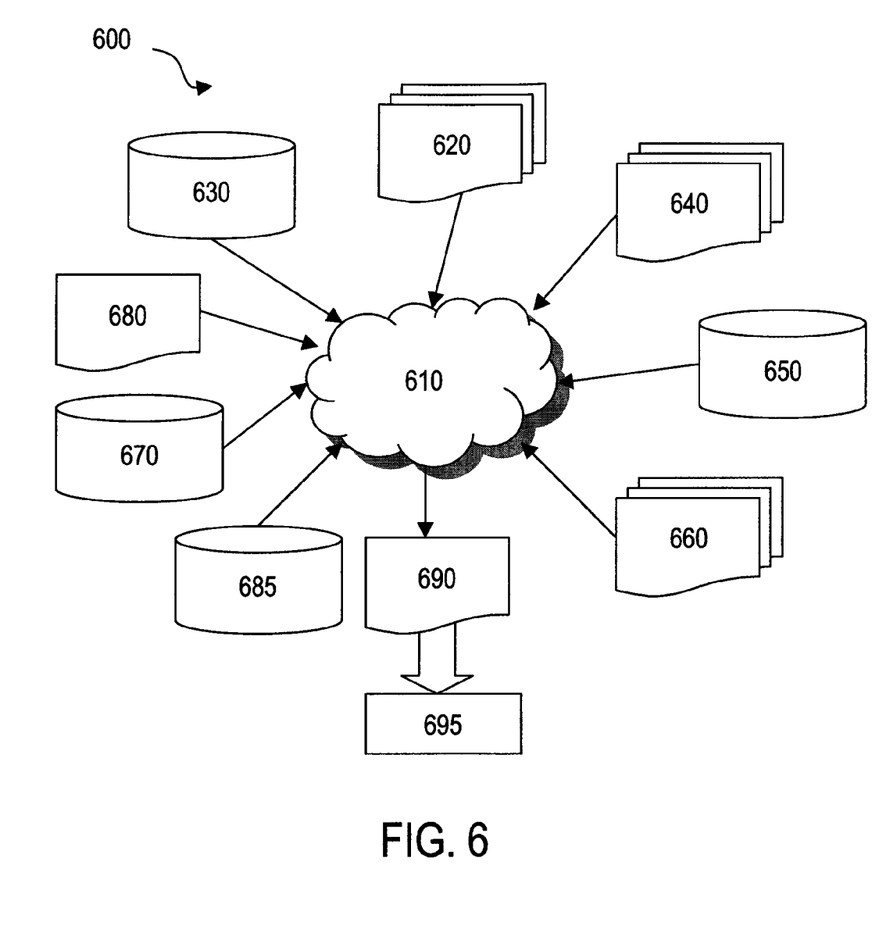
FIG. 6 is a flow diagram of a design process used in semiconductor design, manufacture, and/or test.

FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises an embodiment of the invention as shown in FIG. 2-FIG. 5 in the form of schematics or HDL, a hardware-description language (e.g., Verilog, VHDL, C, etc.). Design structure 620 may be contained on one or more machine-readable medium. For example, design structure 620 may be a text file or a graphical representation of an embodiment of the invention as shown in FIG. 2-FIG. 5. Design process 610 preferably synthesizes (or translates) an embodiment of the invention as shown in FIG. 2-FIG. 5 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is re-synthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIG. 2-FIG. 5, along with any additional integrated circuit design or data (if applicable), into a second design structure 690. Design structure 690 resides on a storage medium in a data format used for the exchange of layout data of integrated circuits (e.g. information stored in a GDSII (GDS2), GLI, OASIS, or any other suitable format for storing such design structures). Design structure 690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2-FIG. 5. Design structure 690 may then proceed to a stage 695 where, for example, design structure 690: proceeds to tape-out, is released to manufacturing, is released to a mask house, is sent to another design house, is sent back to the customer, etc.

While the invention has been particularly shown and described with reference to specific embodiment thereof, it should be understood, however, that the invention is not necessarily limited to the specific process, arrangement, materials and components shown and described above, but may be susceptible to numerous variations within the scope of the invention. For example, although the above-described exemplary aspects of the invention are believed to be particularly well suited for high performance read bypass test circuit, it is contemplated that the concepts of the present invention can be applied in other applications. For example, the concepts of the present application can be utilized whenever it is desired to perform bypass test. The circuits and processes described herein may be represented (without limitation) in software (object code or machine code), in varying stages of compilation, as one or more netlists, in a simulation language, in a hardware description language, by a set of semiconductor processing masks, and as partially or completed realized semiconductor devices. The various alternatives for each of the foregoing as understood by those of skill in the art are also within the scope of this invention. For example, the various types of computer-readable media, software languages (e.g. Verilog, VHDL), simulatable representations (e.g. SPICE netlist), semiconductor processes (e.g. CMOS, GaAs, SiGe, etc), and device types (e.g. FPGA) suitable for using in conjunction with the processes described herein are within the scope of the invention.

It will be apparent to one skilled in the art that the manner of making and using the claimed invention has been adequately disclosed in the above-written description taken together with the drawing.

Finally, although various advantages, aspects, and objects of the present invention have been discussed herein with reference to various embodiments, it will be understood that the scope of the invention should not be limited by the reference to such advantages, aspects, and objects. Rather, the scope of the invention should be determined with reference to the appended claims.

What is claimed is:

1. A design structure embodied in a machine readable medium used in a design process, the design structure comprising:
   a dynamic to static conversion unit for a read output of an SRAM array; and
   a test bypass unit integrated into the dynamic to static conversion unit, so as to allow the read output of the SRAM array to pass through in a non-test mode, without affecting functional performance of the dynamic to static conversion unit, and block the read output of the SRAM array and allow a test signal to pass though in a test mode.

2. The design structure of claim 1, wherein the dynamic to static conversion unit comprises a cross-coupled device.

3. The design structure of claim 2, wherein the integrated test bypass unit comprises a hold buffer that is connected to a clock equivalent leg of the cross-coupled device to control working modes of the bypass unit.

4. The design structure of claim 3, wherein a test signal is sent to the hold buffer and the cross coupled device to choose between a functional mode and a test mode for the dynamic to static conversion unit.

5. The design structure of claim 2, wherein the integrated test bypass unit comprises a complex gate implementation that is connected to the cross-coupled device to select a test input as an output of the dynamic to static conversion unit.

6. The design structure of claim 1, wherein the design structure comprises a netlist.

7. The design structure of claim 1, wherein the design structure resides on a storage medium as a data format for the exchange of layout data of integrated circuits.

8. The design structure of claim 1, wherein the design structure includes at least one of test data, characterization data, verification data, or design specification.

9. An integrated circuit for high performance SRAM (Static Random Access Memory) read bypass for chip logic testing, comprising:
   a dynamic to static conversion unit for a read output of an SRAM array; and
   a test bypass unit integrated into the dynamic to static conversion unit, so as to allow the read output of the SRAM array to pass through in a non-test mode, without affecting functional performance of the dynamic to static conversion unit, and block the read output of the SRAM array and allow a test signal to pass though in a test mode.

10. The integrated circuit of claim 9, wherein the dynamic to static conversion unit comprises a cross-coupled device.

11. The integrated circuit of claim 9, wherein the test bypass unit comprises a hold buffer that is connected to a clock equivalent leg of the cross-coupled device to control working modes of the bypass unit.

12. The integrated circuit of claim 11, wherein a test signal is sent to the hold buffer and the cross coupled device to choose between a functional mode and a test mode for the dynamic to static conversion unit.

13. The integrated circuit of claim 9, wherein the integrated test bypass unit comprises a complex gate implementation that is connected to the cross-coupled device to select a test input as an output of the dynamic to static conversion unit.

14. A method for high performance SRAM (Static Random Access Memory) read bypass for chip logic testing, comprising:
   providing a dynamic to static conversion unit for a read output of an SRAM array; and
   providing a test bypass unit integrated into the dynamic to static conversion unit, so as to allow the read output of the SRAM array to pass through in a non-test mode, without affecting functional performance of the dynamic to static conversion unit, and block the read output of the SRAM array and allow a test signal to pass though in a test mode.

15. The method of claim 14, wherein the dynamic to static conversion unit comprises a cross-coupled device.

16. The method of claim 14, wherein the test bypass unit comprises a hold buffer that is connected to a clock equivalent leg of the cross-coupled device to control working modes of the bypass unit.

17. The method of claim 16, wherein a test signal is sent to the hold buffer and the cross coupled device to choose between a functional mode and a test mode for the dynamic to static conversion unit.

18. The method of claim 14, wherein the integrated test bypass unit comprises a complex gate implementation that is connected to the cross-coupled device to select a test input as an output of the dynamic to static conversion unit.

* * * * *